United States Patent
Sonobe et al.

(10) Patent No.: US 7,501,662 B2
(45) Date of Patent: Mar. 10, 2009

(54) SEMICONDUCTOR LIGHT EMITTING ELEMENT ARRAY ILLUMINATOR USING THE SAME

(75) Inventors: Masayuki Sonobe, Kyoto (JP); Yukio Shakuda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 37 days.

(21) Appl. No.: 11/801,258

(22) Filed: May 9, 2007

(65) Prior Publication Data
US 2007/0262323 A1 Nov. 15, 2007

(30) Foreign Application Priority Data
May 10, 2006 (JP) .............................. 2006-131200

(51) Int. Cl.
*H01L 29/18* (2006.01)
(52) U.S. Cl. .................... 257/88; 257/89; 257/E33.047
(58) Field of Classification Search .................. 257/87, 257/88
See application file for complete search history.

(56) References Cited

U.S. PATENT DOCUMENTS

2004/0008525 A1* 1/2004 Shibata ...................... 362/800
2006/0163589 A1* 7/2006 Fan et al. ...................... 257/88
2006/0169993 A1* 8/2006 Fan et al. ...................... 257/88
2006/0284195 A1  12/2006 Nagai

FOREIGN PATENT DOCUMENTS

| CN | 1264181 | 8/2000 |
|---|---|---|
| EP | 1 030 377 | 8/2000 |
| JP | 2005-79202 | 3/2005 |

OTHER PUBLICATIONS

Office Action for corresponding Chinese Patent Application No. 2007101022898 issued by the State Intellectual Property Office of the People's Republic of China Jul. 25, 2008.

* cited by examiner

*Primary Examiner*—Marcos D. Pizarro
*Assistant Examiner*—Eva Y Montalvo
(74) *Attorney, Agent, or Firm*—Hamre, Schuman, Mueller & Larson, P.C.

(57) ABSTRACT

A semiconductor light emitting element array includes a substrate made of SiC and having a first surface and a second surface opposite to the first surface. The array also includes a plurality of semiconductor light emitting elements supported by the first surface of the substrate. Each of the light emitting elements includes an n-type semiconductor layer, an active layer, and a p-type semiconductor layer. The second surface of the substrate serves as a light emitting surface, from which light produced by the light emitting elements is emitted out.

9 Claims, 4 Drawing Sheets

SEMICONDUCTOR LIGHT EMITTING ELEMENT ARRAY ILLUMINATOR USING THE SAME

BACKGROUND OF THE INVENTION

1. Field of the Invention

The present invention relates to a semiconductor light emitting element array including a plurality of semiconductor light emitting elements such as LEDs, and also to an illuminator using such an array.

2. Description of the Related Art

FIG. 4 shows a conventional semiconductor light emitting element array disclosed by JP-A-2005-79202. In the illustrated semiconductor light emitting element array X, a plurality of semiconductor light emitting elements Ed are provided on a substrate 91. Each of the semiconductor light emitting elements Ed has a multilayer structure consisting of an n-GaN layer 92, an active layer 93 and a p-GaN layer 94. Electrons injected from the n-GaN layer 92 and holes injected from the p-GaN layer 94 recombine in the active layer 93, whereby blue light is emitted. The blue light emitted from the active layer 93 travels through a p-side electrode 95, which is transparent, and then enters a fluorescent layer 96. The fluorescent layer 96 contains fluorescent particles, which convert part of the blue light into yellow light. The yellow light obtained by the conversion mixes with the remaining blue light to change into whitish light, which is emitted from the upper surface of the fluorescent layer 96.

The conventional array, however, suffers the following problem when its brightness is to be increased.

The fluorescent layer 96 is made of a resin material mixed with fluorescent particles. The refractive index of the resin material greatly differs from that of GaN (which is suitable for emitting blue light). Accordingly, when the blue light travels from the p-GaN layer 94 to the fluorescent layer 96, a large part of the blue light is subjected to total internal reflection. As a result, the emission efficiency, i.e., the ratio of the amount of light emitted from the fluorescent layer 96 to the amount of light produced at the active layer 93 is not satisfactorily high.

Further, when a current is applied to energize the semiconductor light emitting elements Ed, the n-GaN layer 92, the active layer 93 and the p-GaN layer 94 are heated. Since most part of the semiconductor light emitting elements Ed is covered by the fluorescent layer 96 mainly composed of resin, heat is unlikely to escape. Heat is also generated by the color conversion of the blue light at the fluorescent layer 96. This heat is trapped in the fluorescent layer 96. As the amount of current to be applied to the semiconductor light emitting element array X increases, more heat is produced. In light of these, it has been desired to enhance the heat dissipation of the array X, so that the array X can be more bright.

SUMMARY OF THE INVENTION

The present invention has been proposed under the circumstances described above. It is an object of the present invention to provide a semiconductor light emitting element array suitable for increasing the luminance, and to provide an illuminator using such a semiconductor light emitting element array.

According to a first aspect of the present invention, there is provided a semiconductor light emitting element array comprising: a substrate made of SiC and including a first surface and a second surface opposite to the first surface; and a plurality of semiconductor light emitting elements supported by the first surface of the substrate, where each of the light emitting elements includes an n-type semiconductor layer, an active layer and a p-type semiconductor layer. Light produced by the light emitting elements is emitted out from the second surface of the substrate.

With the above structure, since SiC has high heat conductivity, the heat conductivity of the substrate is high. Therefore, heat generated from the semiconductor light emitting elements can be dissipated through the substrate. Further, since light is emitted from an light emitting surface (the second surface) positioned on the opposite side of the semiconductor light emitting elements, the semiconductor light emitting elements do not need to be covered by a color-conversion layer made of e.g. resin. Thus, the semiconductor light emitting element array can properly dissipate the heat produced in light emission, so that the current can be increased to increase the luminance. Further, the refractive index of SiC does not differ greatly from that of GaN, which is a typical semiconductor material. Therefore, the light emitted from the active layer is less likely to be totally reflected inward by the substrate.

In a preferred embodiment of the present invention, a color conversion layer containing SiC is provided between the substrate and the semiconductor light emitting elements. With this structure, the heat from the semiconductor light emitting elements can be transferred to the substrate through the color conversion layer. Further, when SiC containing donor and acceptor is used, blue light emitted from the semiconductor light emitting elements can be converted into white light with high conversion efficiency.

In a preferred embodiment of the present invention, in each of the semiconductor light emitting elements, the n-type semiconductor layer, the active layer and the p-type semiconductor layer are stacked in the mentioned order from the substrate side, and adjacent ones of the semiconductor light emitting elements are separated from each other by a groove extending toward the substrate beyond the n-type semiconductor layers. This structure electrically separates the semiconductor light emitting elements from each other. Therefore, the generation of leakage current between the semiconductor light emitting elements can be properly prevented, which is advantageous for increasing the current for the semiconductor light emitting element array.

In a preferred embodiment of the present invention, an additional p-type semiconductor layer is interposed between the substrate and the n-type semiconductor layers of the respective light emitting elements. With this structure, there exists a boundary surface having a high resistance between the n-type semiconductor layer and the additional p-type semiconductor layer. This is advantageous for suppressing leakage current between the semiconductor light emitting elements.

In a preferred embodiment of the present invention, the semiconductor light emitting element array further comprises metal inter-element wiring for electrically connecting the light emitting elements to each other, where the inter-element wiring is arranged to overlap at least part of the active layer of each light emitting element as viewed in the thickness direction of the substrate. With this structure, the light traveling from the active layer is reflected by the inter-element wiring and sent back toward the substrate. This is advantageous for improving the luminance of the semiconductor light emitting element array.

In a preferred embodiment of the present invention, the semiconductor light emitting element array further comprises a boundary surface which is positioned between the active layer and the substrate. Such a boundary surface may be made between an SiC-containing layer and a buffer layer having a refractive index different from that of SiC. In this embodiment, the distance t between the boundary surface and the active layer of each light emitting element is chosen to satisfy a formula: $t=a\times(\lambda/2n)\times(1\pm x)$, where $\lambda$ is the wavelength of light emitted from the light emitting elements, a is an integer, n is the refractive index of each n-type semiconductor layer, and $0 \leq x \leq 10\%$ (i.e. 0.1). With this arrangement, light from the active layer can be amplified between the active layer and the boundary surface. Accordingly, the luminance of the semiconductor light emitting element array can be further increased.

In a preferred embodiment of the present invention, the semiconductor light emitting element array further comprises a pair of terminals for supplying power to the semiconductor light emitting elements. In this embodiment, all the light emitting elements may be divided into two groups, that is, a first group and a second group. In each group, the semiconductor light emitting elements are connected in series between the two terminals. The forward direction of the light emitting elements belonging to the first group is opposite to that of the light emitting elements belonging to the second group. With this arrangement, it is possible to cause the light emitting element array to produce light continuously (to human eyes) by utilizing an AC power source.

According to a second aspect of the present invention, there is provided an illuminator comprising a semiconductor light emitting element array according to the first aspect of the present invention. Such an illuminator may further comprise a metal supporting member held in contact with the substrate of the light emitting element array, and a fixing base connected to the metal supporting member. The fixing base may be a screw-in base, for example, and configured to receive power from an external power source. The received power is supplied to the light emitting element array through the metal supporting member.

With the above arrangement, heat from the semiconductor light emitting element array can be properly dissipated through the metal supporting member.

Other features and advantages of the present invention will become more apparent from detailed description given below with reference to the accompanying drawings.

DETAILED DESCRIPTION OF THE PREFERRED EMBODIMENTS

Preferred embodiments of the present invention will be described below with reference to the accompanying drawings.

Figure 1:
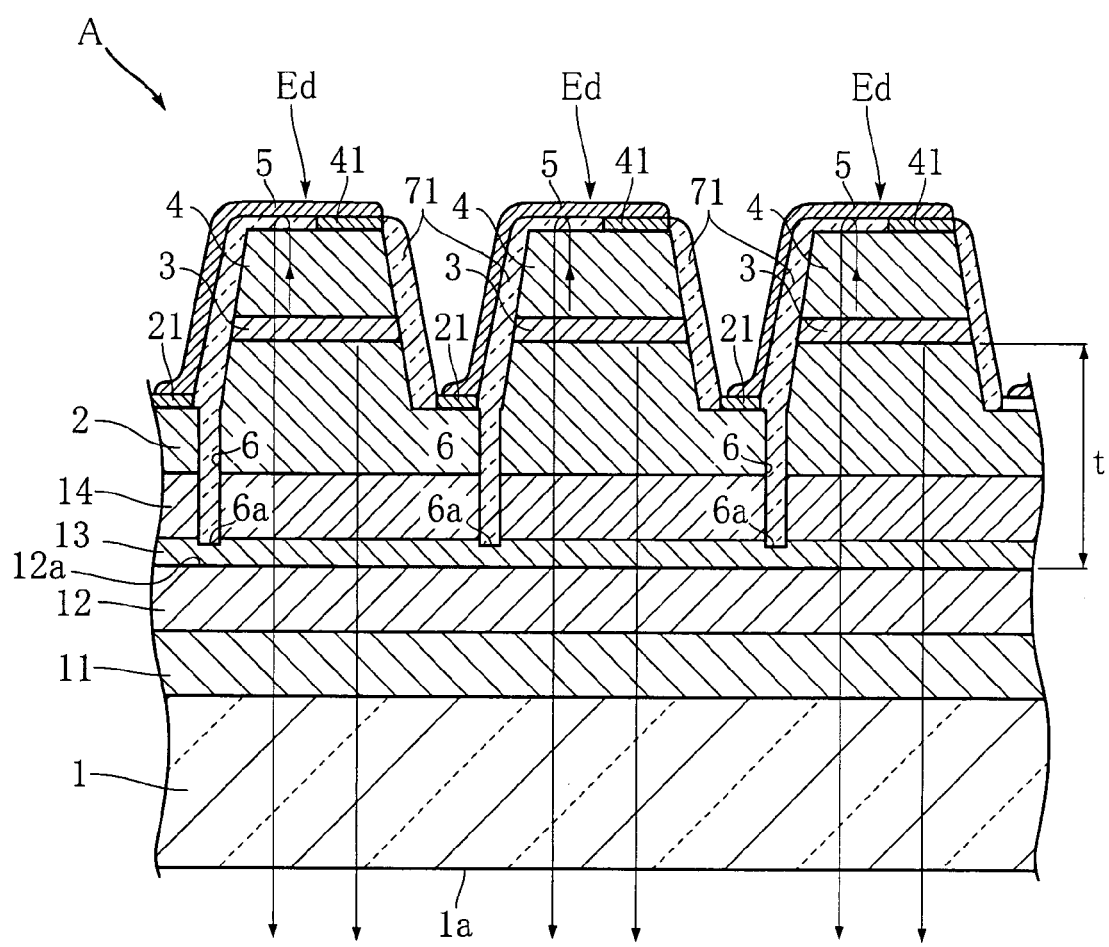
FIG. 1 is a sectional view showing principal portions a semiconductor light emitting element array according to the present invention.
Figure 2:
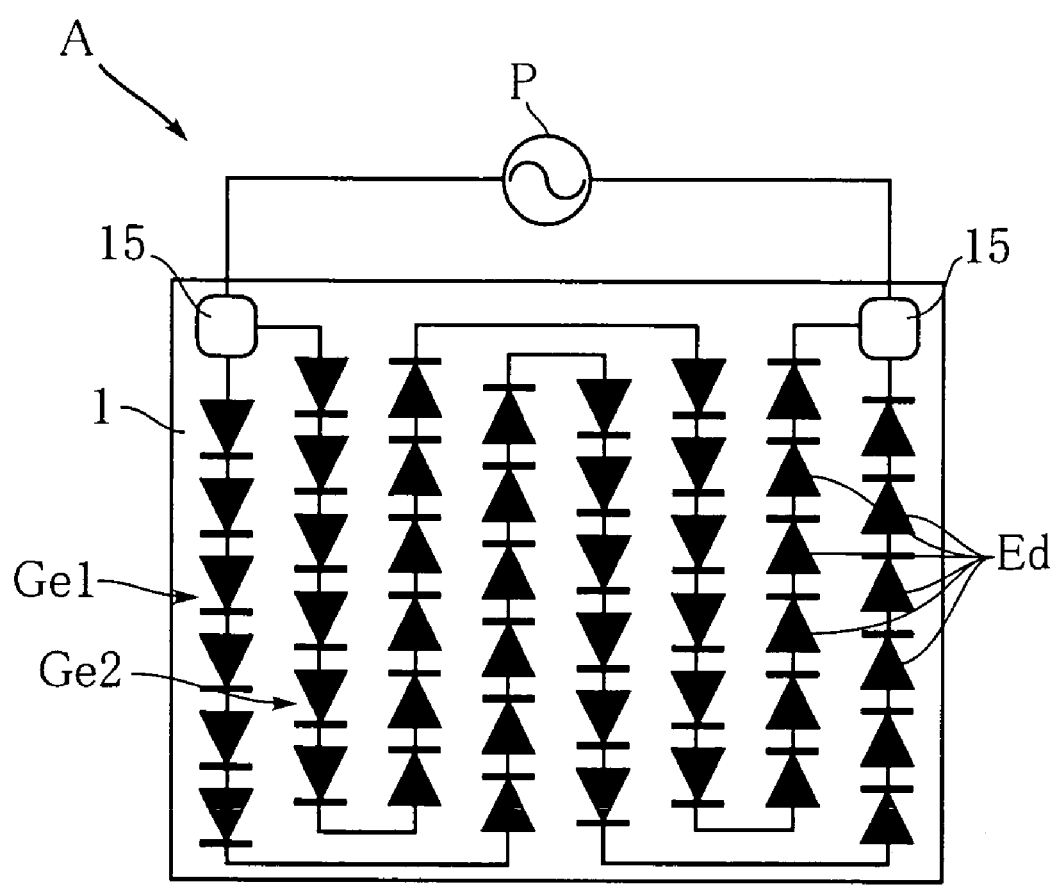
FIG. 2 is a schematic plan view showing the semiconductor light emitting element array of the present invention.

FIGS. 1 and 2 show an example of a semiconductor light emitting element array according to the present invention. The illustrated array A includes a substrate 1 and a plurality of semiconductor elements Ed which are provided on the substrate 1 and configured to emit light. As shown in FIG. 1, light is emitted downward from the substrate 1 of the array A. As viewed in plan, the array A may be square, having a side of about 0.4 to 1.5 mm, for example.

The substrate 1, made of SiC, permits the passage of visible light such as red, green, blue and white light, while selectively absorbing ultraviolet rays. In the illustrated example, the substrate 1 has a thickness of about 200 μm. The lower surface of the substrate 1 serves as a light emitting surface 1a through which light is to be emitted. In the illustrated example, the light emitting surface 1a is a flat, smooth surface. Alternatively, the light emitting surface 1a may be made as an irregular surface suitable for enhancing the light emission efficiency. On the substrate 1, an SiC color conversion layer 11, an n-SiC layer 12, a buffer layer 13 and a p-GaN layer 14 are stacked.

The SiC color conversion layer 11 serves to convert blue light emitted from the light emitting elements Ed into white light. The SiC color conversion layer 11 is mainly composed of SiC, in which donors and acceptors are contained. In the SiC color conversion layer 11, the donor serves as an electron provider, whereas the acceptor serves to a hole provider. When the SiC color conversion layer is irradiated with blue light, a radiative recombination occurs between a donor and an acceptor, thereby emitting light. For converting blue light into white light, preferably the donor in the color conversion layer 11 may be N and the acceptor may be B or Al. The concentration of the donor and the acceptor may preferably be about $1.0 \times 10^{15}$ to $1.0 \times 10^{20}$ atoms/cm$^3$. The thickness of the SiC color conversion layer 11 may be about 20 to 200 μm.

The n-SiC layer 12 is an n-type semiconductor layer obtained by doping e.g. N into SiC. Though the crystal structure of the SiC color conversion layer 11 tends to deteriorate due to the inclusion of the donors and the acceptors, the defect can be compensated by the provision of the n-SiC layer 12 having a better crystal structure than the SiC color conversion layer 11. In the illustrated example, the n-SiC layer 12 may have a thickness of about 2 to 4 μm.

The buffer layer 13, for example made of AlGaN, is provided for alleviating lattice defects of SiC and GaN, such as lattice strain and lattice mismatch. Due to the provision of the buffer layer 13, the p-GaN layer 14, the n-GaN layer 2, the active layer 3 and the p-GaN layer 4 can be stable on the n-SiC layer 12. In the illustrated example, the buffer layer 13 may have a thickness of about 20 to 200 nm.

The refractive index of AlGaN (used for making the buffer layer 13) is about 2.5, whereas the refractive index of SiC (used for making the n-SiC layer 12) is about 2.6. The boundary surface 12a between the n-SiC layer 12 and the AlGaN layer 13 (having different refractive indices) is more likely to reflect light than a boundary surface between layers of the same material. The distance t between the boundary surface 12a and the active layer 3 is chosen to satisfy the formula $t=a\times(\lambda/2n)\times(1\pm x)$, where $\lambda$ is the wavelength of the light emitted from the active layer 3, a is a positive integer, n is the refractive index of the n-GaN layer 2, and x is 0 or a positive number which is no greater than 0.1 ($\leq 10\%$). In the illustrated example, the wavelength $\lambda$ is about 460 nm, and the distance t is about 0.92 to 1.84 μm.

The p-GaN layer 14 is made of a p-type semiconductor obtained by doping e.g. Mg into GaN. In the illustrated example, the p-GaN layer 14 has a thickness of about 300 nm. The light emitting elements Ed are arranged on the p-GaN layer 14.

Each of the light emitting elements Ed is made up of the n-GaN layer 2, the active layer 3 and the p-GaN layer 4. About 5 to 50 semiconductor light emitting elements Ed maybe arranged in a matrix.

The n-GaN layer 2 is made of an n-type semiconductor obtained by doping e.g. Si into GaN. In the illustrated example, the n-GaN layer 2 includes a thicker portion having a thickness of about 0.6 to 1.34 μm and a thinner portion having a thickness of about 0.3 to 0.67 μm. The thinner portion is provided with an n-side electrode 21. The n-side electrode 21 may be formed by stacking Ti and Al.

The active layer 3 has a multiple quantum well (MQW) structure including e.g. InGaN, and serves to amplify the light emitted by the recombination of electrons and holes. The active layer 3 may include a plurality of InGaN layers and a plurality of GaN layers which are alternately stacked. Each InGaN layer may contain about 17% of In and has a band gap which is smaller than that of the n-GaN layer 2. Thus, the InGaN layers constitute well layers in the active layer 3. The GaN layers, on the other hand, constitute barrier layers in the active layer 3. In the illustrated example, the InGaN layers (each having a thickness of about 1.5 to 4.0 nm) and the GaN layers (each having a thickness of about 6 to 20 nm) are stacked so that the overall thickness of the active layer 3 becomes about 100 nm. To alleviate the lattice defect, a superlattice layer in which InGaN and GaN are alternately stacked for every atom may be provided between the n-GaN layer 2 and the active layer 3.

The p-GaN layer 4 is made of a p-type semiconductor obtained by doping e.g. Mg into GaN. In the illustrated example, the p-GaN layer 4 has a thickness of about 50 to 200 nm. On the p-GaN layer 4, a p-side electrode 41 is provided. The p-side electrode 41 is made of Ni, for example, and covers a right-side portion of the upper surface of the p-GaN layer 4, as shown in the figure. It is to be noted that a GaN layer or an InGaN layer containing about 0.1% of In may be provided between the active layer 3 and the p-GaN layer 4.

The p-side electrode 41 of each semiconductor light emitting element Ed is connected to the n-side electrode 21 of the adjacent semiconductor light emitting element Ed via an inter-element wiring 5. The inter-element wiring 5 is made of Al or Pt, for example, and has relatively high reflectivity. The inter-element wiring 5 is formed to bridge between the p-side electrode 41, which is formed on the right-side portion of the upper surface of each semiconductor light emitting element Ed, and the n-side electrode 21 of the light emitting element Ed on the left side of that semiconductor light emitting element Ed. Thus, the portion of the p-GaN layer 4, which is not covered by the p-side electrode 41, is covered by the inter-element wiring 5. The illustrated three semiconductor light emitting elements Ed are connected in series to each other by the inter-element wiring 5.

Grooves 6 are formed between respective adjacent semiconductor light emitting elements Ed. The grooves 6 are provided for electrically separating the adjacent semiconductor light emitting elements Ed. The bottom 6a of each groove 6 is at a position which is closer to the substrate 1 beyond the n-GaN layer 2. In the illustrated example, each groove 6 extends downward through the n-GaN layer 2 and the p-GaN layer 14 until the bottom 6a reaches the buffer layer 13. The grooves 6 may be formed by etching.

An insulating film 71 is provided in each groove 6, at the region between each semiconductor light emitting element Ed and the inter-element wiring 5 and at part of the obverse surface of the light emitting element Ed. The insulating film 71 is made of $SiO_2$, for example, and transparent to the visible light.

FIG. 2 is a schematic view showing the array A. As shown in the figure, the light emitting elements Ed of the array A are divided into two groups Ge1 and Ge2. In each of the groups Ge1 and Ge2, the light emitting elements Ed are connected in series to each other by the above-described inter-element wiring 5. Each group Ge1, Ge2 of the light emitting elements is connected to a pair of terminals 15 provided on the substrate 1. The terminals 15 are utilized for connecting e.g. an AC power source P to the array A. The light emitting elements Ed of the group Ge1 are so connected that the forward direction thereof is from the terminal 15 on the left side to the terminal 15 on the right side in the figure. On the other hand, the light emitting elements Ed of the group Ge2 are so connected that the forward direction thereof is from the terminal 15 on the right side to the terminal 15 on the left side in the figure. With this arrangement, the light emitting elements Ed of the group Ge1 and those of the group Ge2 are alternately turned on when AC voltage is applied from the AC power source P.

Figure 3:
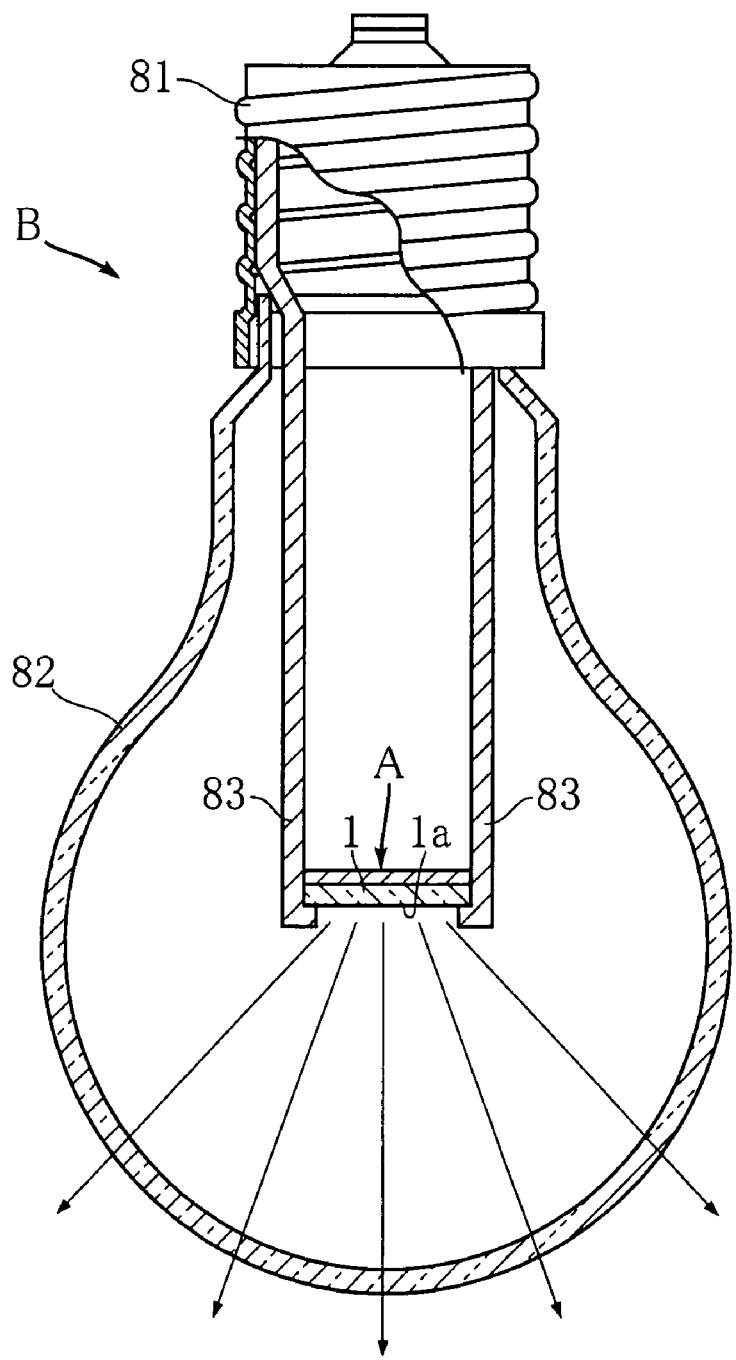
FIG. 3 is a sectional view showing an illuminator incorporating the light emitting element array of the present invention.

FIG. 3 shows an example of illuminator using the array A described above. The illustrated electric lamp B includes a screw-in base 81, a glass bulb 82, metal members 83 and a semiconductor light emitting element array A.

The base 81 is utilized for supplying power to the array A and connecting the electric lamp B to a socket, for example. The base 81 is generally cylindrical and formed with a helical projection. The base 81 may be of a type that conforms to Japanese Industrial Standards (JIS) E17 or E26.

The glass bulb 82 is made of glass and permits the passage of light emitted from the array A. As required, the glass bulb 82 may be colored for adjusting the tone of the light from the array A.

The metal members 83 are provided for fixing the array A to the base 81. The metal members 83 are made of Cu, for example, and bonded to the substrate 1 of the array A. The metal members 83 electrically connect the array A and the base 81 to each other. The metal members 83 are connected to the paired terminals 15 shown in FIG. 2 by e.g. a wire (not shown).

In the electric lamp B, the light emitting surface 1a of the substrate 1 is directed toward the top of the glass bulb 82. Thus, the light emitted from the surface 1a passes through the spherical portion of the glass bulb 82 as it spreads out.

The function and advantageous features of the array A and the electric lamp B will be described below.

Figure 4:
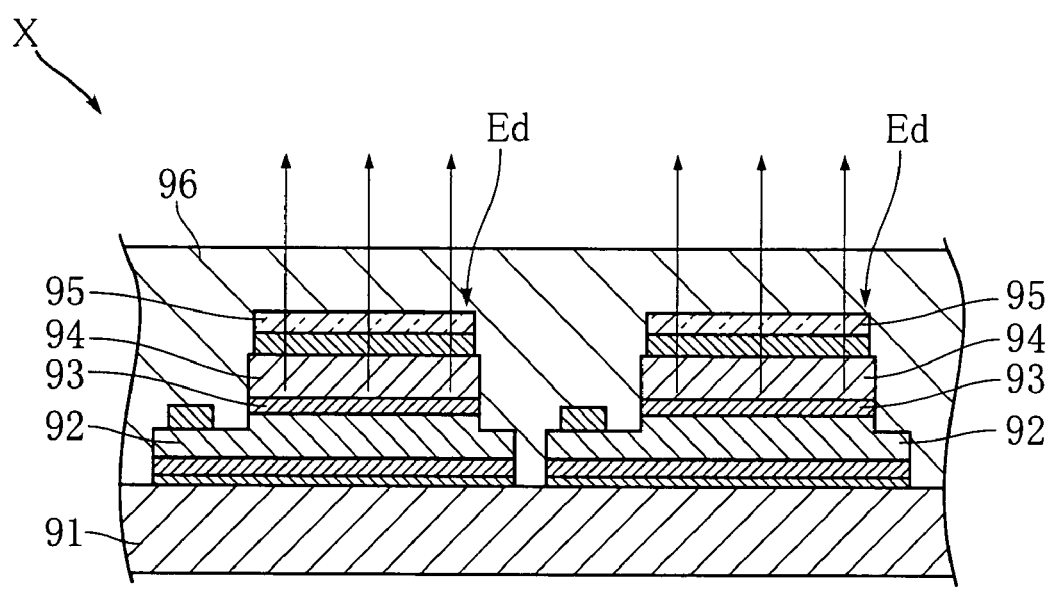
FIG. 4 is a sectional view illustrating a conventional semiconductor light emitting element array.

According to the present invention, the light emitted from the light emitting elements Ed is subjected to color conversion at the SiC color conversion layer 11 held in contact with the substrate 1 (see FIG. 1). The heat generated upon the color conversion is readily transmitted to the substrate 1 which is made of SiC having relatively high heat conductivity. Further, unlike the conventional structure shown in FIG. 4, the light emitting elements Ed are not covered with a thick fluorescent resin layer. Thus, the heat from the light emitting elements Ed is not unduly trapped, which permits application of strong electric current to the array A to increase the luminance. Further, in the electric lamp B, the metal members 83 are bonded to the substrate 1, whereby the heat generated at the array A can be transmitted from the substrate 1 to the metal members 83. This ensures a prolonged life of the electric lamp B even with strong current applied to the lamp.

By the color conversion using the SiC color conversion layer 11 containing donors and acceptors, the blue light emitted from the light emitting elements Ed can be converted into white or whitish light. The conversion efficiency of this process is considerably higher than that of the conventional color conversion using a fluorescent material. Thus, the array A can emit strong white light. Further, SiC forming the substrate 1 absorbs ultraviolet rays. Precisely, the substrate 1 absorbs ultraviolet light emitted from the elements Ed, while allowing the passage of other light such as visible light. (In other words, the substrate 1 selectively absorbs ultraviolet light.) In this manner, the array A can suppress effects of ultraviolet rays on the human body and is hence suitable for the electric lamp B.

The light emitting elements Ed are separated from each other by the grooves 6. The bottom 6a of each groove 6 is positioned closer to the substrate 1 beyond the n-GaN layer 2. With this structure, respective n-GaN layers 2 of the light emitting elements Ed are completely separated from each other. Further, by the provision of the p-GaN layer 14 under the n-GaN layer 2, a boundary surface having a high resistance is formed between the n-GaN layer 2 and the p-GaN layer 14. With the structure, the light emitting elements Ed are not electrically connected to each other, so that the generation of leakage current can be properly prevented. This is advantageous for increasing the current for the array A.

The light traveling from the active layer 3 upward in the figure passes through the transparent insulating film 71 and is reflected downward by the inter-element wiring 5. Since the inter-element wiring 5 has relatively high reflectivity, the attenuation of light due to the reflection can be prevented. This is advantageous for increasing the luminance of the array A. The p-side electrode 41, made of e.g. Ni, ensures good ohmic contact with the p-GaN layer 4, but its contact surface with the p-GaN layer 4 tends to darken. In the illustrated example, however, the p-side electrode 41 is formed on only a limited part of the p-GaN layer 4. Therefore, the absorption of light by the darkened contact surface can be suppressed.

By setting the distance t between the active layer 3 and the boundary surface 12a to a value which satisfies the equation described above, the light having a wavelength λ emitted from the active layer 3 can be amplified by the repetitive reflection in this region having the distance t. This light amplification effect is obtained with respect to the thickness direction of the substrate 1, while the light traveling in the in-plane direction of the substrate 1 is not amplified. Therefore, the light traveling in the thickness direction of the substrate 1 becomes dominant, and the brightness of the light traveling in the in-plane direction of the substrate 1 is negligibly small as compared with that of the light in the thickness direction. Therefore, while increasing the luminance of the light emitted from the light emitting surface 1a, it is possible to suppress the leakage of light from portions other than the light emitting surface 1a. The light amplification effect can be properly exhibited by setting the distance t within +10% or 0.1 of an integer multiple of $\lambda \times \frac{1}{2}n$.

By dividing the light emitting elements Ed into two groups Ge1 and Ge2 whose respective forward directions are opposite from each other, the light emitting elements Ed of the group Ge1 and those of the group Ge2 can be turned on alternately by the alternating current from the AC power source P. To the naked eye, the light emitting elements Ed of the group Ge1 and those of the group. Ge2 appear to be turned on simultaneously when the frequency of the AC power source P is 50 Hz or 60 Hz, for example. Therefore, the array A can uniformly illuminate a relatively wide area by utilizing the power supply from the household power source. Further, the electric lamp 8 is provided with the base 81 conforming to JIS E17 and E26. Thus, the electric lamp 8 can be widely used as a replacement for a conventional lamp such as a incandescent lamp.

The semiconductor light emitting element array and the illuminator of the present invention is not limited to the foregoing embodiment. The specific structure of each part of the semiconductor light emitting element array and the illuminator can be varied in various ways.

The n-type semiconductor layer, the active layer, the p-type semiconductor layer and the additional p-type semiconductor layer in the present invention are not limited to those mainly composed of GaN and may be made of other material which is capable of properly emitting light by the recombination of electrons and holes. The color conversion layer containing SiC is suitable for converting light into white light with high conversion efficiency and absorbing ultraviolet rays. However, in the semiconductor light emitting element array according to the present invention, a different kind of color conversion layer may be used or the light from the active layer may be emitted directly without using a color conversion layer. Although light emission by utilizing an AC power source becomes possible by dividing the light emitting elements into two groups of different forward directions, the present invention is not limited to this. The light emitting elements may not be divided into a plurality of groups, and the light emission may be performed by utilizing a DC power source.

The illuminator according to the present invention is not limited to the above-described electric lamp. The illuminator may have a structure suitable for use as a replacement for a general bar-shaped fluorescent lamp. Such a structure can be provided by appropriately changing the shape of the connection portion, for example. Further, the illuminator according to the present invention is not limited to one usable as a replacement for a conventional standardized illuminator. The illuminator according to the present invention may be structured as a special illuminator including a semiconductor light emitting element array of a size capable of covering the entire surface of the illuminator.

The invention claimed is:

1. A semiconductor light emitting element array comprising:
   a substrate made of SIC and including a first surface and a second surface opposite to the first surface;
   a plurality of semiconductor light emitting elements supported by the first surface of the substrate, each of the light emitting elements including an n-type semiconductor layer, an active layer and a p-type semiconductor layer; and
   a color conversion layer containing SiC and provided between the substrate and the semiconductor light emitting elements;
   wherein light produced by the light emitting elements is emitted out from the second surface of the substrate.

2. The array according to claim 1, wherein the n-type semiconductor layer, the active layer and the p-type semiconductor layer of each light emitting element are stacked in this order as viewed from the substrate, and wherein adjacent ones of the semiconductor light emitting elements are separated from each other by a groove extending toward the substrate beyond the n-type semiconductor layers.

3. The array according to claim 2, further comprising an additional p-type semiconductor layer disposed between the substrate and the n-type semiconductor layers of the light emitting elements.

4. The array according to claim 1, further comprising metal inter-element wiring for electrically connecting the semiconductor light emitting elements to each other, wherein the inter-element wiring overlaps at least part of the active layer of each light emitting element as viewed in a thickness direction of the substrate.

5. The array according to claim 1, further comprising an SiC-containing layer and a buffer layer having a refractive index different from that of SiC, wherein a boundary surface between the SiC-containing layer and the buffer layer is arranged between the active layer of each light emitting element and the substrate, and wherein a distance t between the boundary surface and the active layer of each light emitting element is chosen to satisfy a formula $t=a\times(\lambda/2n)\times(1\pm x)$, where $\lambda$ is a wavelength of light emitted from each light emitting element, a is an integer, n is a refractive index of each n-type semiconductor layer, and $0 \leqq x \leqq 0.1$.

6. The array according to claim 1, further comprising paired terminals for supplying power to the semiconductor light emitting elements, wherein the semiconductor light emitting elements are divided into a first group and a second group, the light emitting elements of each group being connected in series between the paired terminals, and wherein a forward direction of the light emitting elements of the first group is opposite to a forward direction of the light emitting elements of the second group.

7. An illuminator comprising: a semiconductor light emitting element array according to claim 1;
   a metal supporting member held in contact with the substrate of the array and supporting the array; and
   a fixing base connected to the metal supporting member and receiving power from an external power source.

8. A semiconductor light emitting element array comprising:
   a substrate made of SiC and including a first surface and a second surface opposite to the first surface; and
   a plurality of semiconductor light emitting elements supported by the first surface of the substrate, each of the light emitting elements including an n-type semiconductor layer, an active layer and a p-type semiconductor layer;
   wherein light produced by the light emitting elements is emitted out from the second surface of the substrate;
   wherein the n-type semiconductor layer, the active layer and the p-type semiconductor layer of each light emitting element are stacked in this order as viewed from the substrate;
   wherein adjacent ones of the semiconductor light emitting elements are separated from each other by a groove extending toward the substrate beyond the n-type semiconductor layers;
   wherein each of the semiconductor light emitting elements further comprises an additional p-type semiconductor layer disposed between the substrate and the n-type semiconductor layers of the light emitting elements.

9. A semiconductor light emitting element array comprising:
   a substrate made of SiC and including a first surface and a second surface opposite to the first surface;
   a plurality of semiconductor light emitting elements supported by the first surface of the substrate, each of the light emitting elements including an n-type semiconductor layer, an active layer and a p-type semiconductor layer;
   an SiC-containing layer; and
   a buffer layer having a refractive index different from that of SiC;
   wherein light produced by the light emitting elements is emitted out from the second surface of the substrate;
   wherein a boundary surface between the SiC-containing layer and the buffer layer is arranged between the active layer of each light emitting element and the substrate; and
   wherein a distance t between the boundary surface and the active layer of each light emitting element is chosen to satisfy a formula $t=a\times(\lambda/2n)\times(1\pm x)$, where $\lambda$ is a wavelength of light emitted from each light emitting element, a is an integer, n is a refractive index of each n-type semiconductor layer, and $0 \leqq x \leqq 0.1$.

* * * * *